(12) United States Patent
Laakso et al.

(10) Patent No.: US 7,656,638 B2
(45) Date of Patent: Feb. 2, 2010

(54) EARTHING AND OVERVOLTAGE PROTECTION ARRANGEMENT

(75) Inventors: Kari-Matti Laakso, Pietarsaari (FI); Andreas Berts, Korsholm (FI); Janne Kuivalainen, Vaasa (FI)

(73) Assignee: ABB Oy, Helsinki (FI)

( * ) Notice: Subject to any disclaimer, the term of this patent is extended or adjusted under 35 U.S.C. 154(b) by 174 days.

(21) Appl. No.: 11/600,817

(22) Filed: Nov. 17, 2006

(65) Prior Publication Data
US 2007/0121269 A1 May 31, 2007

Related U.S. Application Data

(63) Continuation of application No. PCT/FI2005/000222, filed on May 17, 2005.

(30) Foreign Application Priority Data
May 18, 2004 (FI) ................................. 20040695

(51) Int. Cl.
*H02H 3/22* (2006.01)
(52) U.S. Cl. ..................................... 361/117
(58) Field of Classification Search ................ 361/117
See application file for complete search history.

(56) References Cited

U.S. PATENT DOCUMENTS 3,641,394 A * 2/1972 Hirose et al. ................. 361/86
4,440,172 A * 4/1984 Langer ............................ 607/4
5,347,185 A * 9/1994 Tailliet ........................ 327/326
5,903,145 A 5/1999 Hemminger et al.
6,853,529 B2 2/2005 Kouwenhoven et al.
2005/0059358 A1* 3/2005 Block et al. ................... 455/78

FOREIGN PATENT DOCUMENTS

CN         2321155 Y       5/1999

(Continued)

OTHER PUBLICATIONS

Abb Strömberg, Teknisiä Tietoja Ja Taulukoita, Vassa Oy, Vaasa, 1990, see pp. 120-122, 163-172, 198-207 and the figures on the pages).

(Continued)

*Primary Examiner*—Stephen W Jackson
*Assistant Examiner*—Scott Bauer
(74) *Attorney, Agent, or Firm*—Buchanan Ingersoll & Rooney PC

(57) ABSTRACT

An earthing of an electronic circuit is disclosed in a device belonging to a low-voltage system with, for example, a maximum AC voltage of 1000 V or a maximum DC voltage of 1500 V in which the device is at the main voltage potential or is connected to the main voltage through a high-impedance coupling. An overvoltage protection of the interface between such an electronic circuit and a SELV (Safety Extra Low Voltage) circuit is also disclosed. The neutral point (COM) of the electronic device is coupled to protective earth (PE) through at least one breakdown-based overvoltage protector. The rated breakdown voltage of the overvoltage protector is higher than the voltage present across it in normal operating conditions but lower than the minimum dielectric strength of the component forming the interface between the electronic device and the SELV circuit.

13 Claims, 3 Drawing Sheets

FOREIGN PATENT DOCUMENTS

| | | |
|---|---|---|
| DE | 32 09 186 A1 | 9/1983 |
| DE | 198 11 269 C1 | 10/1999 |
| DE | 101 62 822 A1 | 6/2003 |
| FR | 2 566 582 | 12/1985 |
| FR | 2 741 756 | 5/1997 |

OTHER PUBLICATIONS

Chinese Office Action issued Sep. 19, 2008 in corresponding Chinese Application No. 200580015754.3 and English translation.

* cited by examiner

EARTHING AND OVERVOLTAGE PROTECTION ARRANGEMENT

CROSS-REFERENCE TO RELATED PATENT APPLICATIONS

This application is based on and claims priority under 35 U.S.C. §119 to Finnish Application No. 20040695, filed May 18, 2004 and is a continuation application under 35 U.S.C. §120 of International Application No. PCT/FI2005/000222, filed May 17, 2005 designating the U.S., the entire contents of both of which are hereby incorporated by reference.

FIELD

Grounding is disclosed of an electronic circuit in a device belonging to a low-voltage system with a maximum AC voltage of, for example, 1000 V or a maximum DC voltage of, for example, 1500 V in which the device is at the main voltage potential or is connected to the main voltage through a high-impedance coupling, as well as to the overvoltage protection of the interface between such an electronic circuit and a SELV (Safety Extra Low Voltage) circuit.

Examples of such electronic devices include instruments for measuring electrical quantities such as voltage, current or frequency. Exemplary embodiments isolate electronic devices from SELV circuits using components with a lower insulation level than would otherwise be possible in accordance with construction requirements.

BACKGROUND INFORMATION

One prior art solution is to use a voltage transformer to reduce the voltage to be measured to a SELV level and isolate the circuits from each other, as well. For current measurements, the signal level is converted and isolation carried out by using a current transformer, correspondingly. The large size and high price of the transformer are disadvantages. In applications susceptible to vibration, the heavy transformer and its electric connections may become detached from the printed circuit board.

When an electronic circuit is at a floating potential or is isolated from the main circuit using a high-impedance coupling, signalling and connections to the SELV circuit can be implemented using components with the required dielectric strength. In practice, solutions employing resistive voltage division have been common in three-phase networks having a voltage of no more than 400 V, as the power loss in the voltage division resistors and the dielectric strength required of the isolation transformers have led to large-size solutions.

In connection with the design of power distribution system equipment for the "Overvoltage Category III" or higher, and environments with "Pollution Degree III", the requirements for creepage and clearance distances mean that signal and power supply components suitable for the SELV interface of conventional floating solutions are expensive or not available at all.

A floating electronic measurement circuit can also be earthed through a high-impedance coupling, but care must be taken to ensure that the number of devices connected in parallel does not become too high to bring the earth resistance of the electrical system below the limit specified in the regulations.

SUMMARY

According to an exemplary embodiment, in a single- or two-phase connection, a floating neutral point is created by connecting a high resistance to the neutral or live conductor or, in connection with a three-phase network, an artificial neutral point is created, for example, by connecting a resistance to each main voltage and arranging the other ends of all three resistances into a star coupling. This floating or artificial neutral point is earthed by connecting a breakdown-based overvoltage protection arrangement between the neutral point and protective earth (PE). The overvoltage protection arrangement can comprise a series of diodes with at least one semiconductor diode connected in the forward and reverse directions. Components can be selected so that the floating neutral point voltage at which the arrangement becomes conductive will be lower than the dielectric strength between the floating or artificial neutral point and the SELV circuit.

This means that in normal operating conditions, the neutral point potential of the measurement electronics floats freely, as the leak current flowing through the diodes can be on the order of, for example, 5 µA. If surge voltage or another type of spurious voltage increases the potential of the floating neutral point (COM) in relation to the protective earth (PE), the reverse breakdown voltage of the diode is exceeded and the resulting avalanche breakdown causes a flow of current. The voltage will not be able to increase to a level that would exceed the dielectric strength of the components between the measurement electronics and the SELV circuit.

Instead of opposite-direction diodes connected in series, other types of components with a suitable breakdown voltage can be used; these include the avalanche-triggered bidirectional protection device described in the patent publication FR2566582, overvoltage protectors based on a spark gap—such as a gas-discharge tube—or metal oxide varistors. However, the price and size of these replacement components can be less advantageous compared to the diode arrangement.

DESCRIPTION OF THE DRAWINGS

In the following, exemplary embodiments will be described in more detail through example embodiments and references to the enclosed drawings, where.

DETAILED DESCRIPTION

Figure 1:
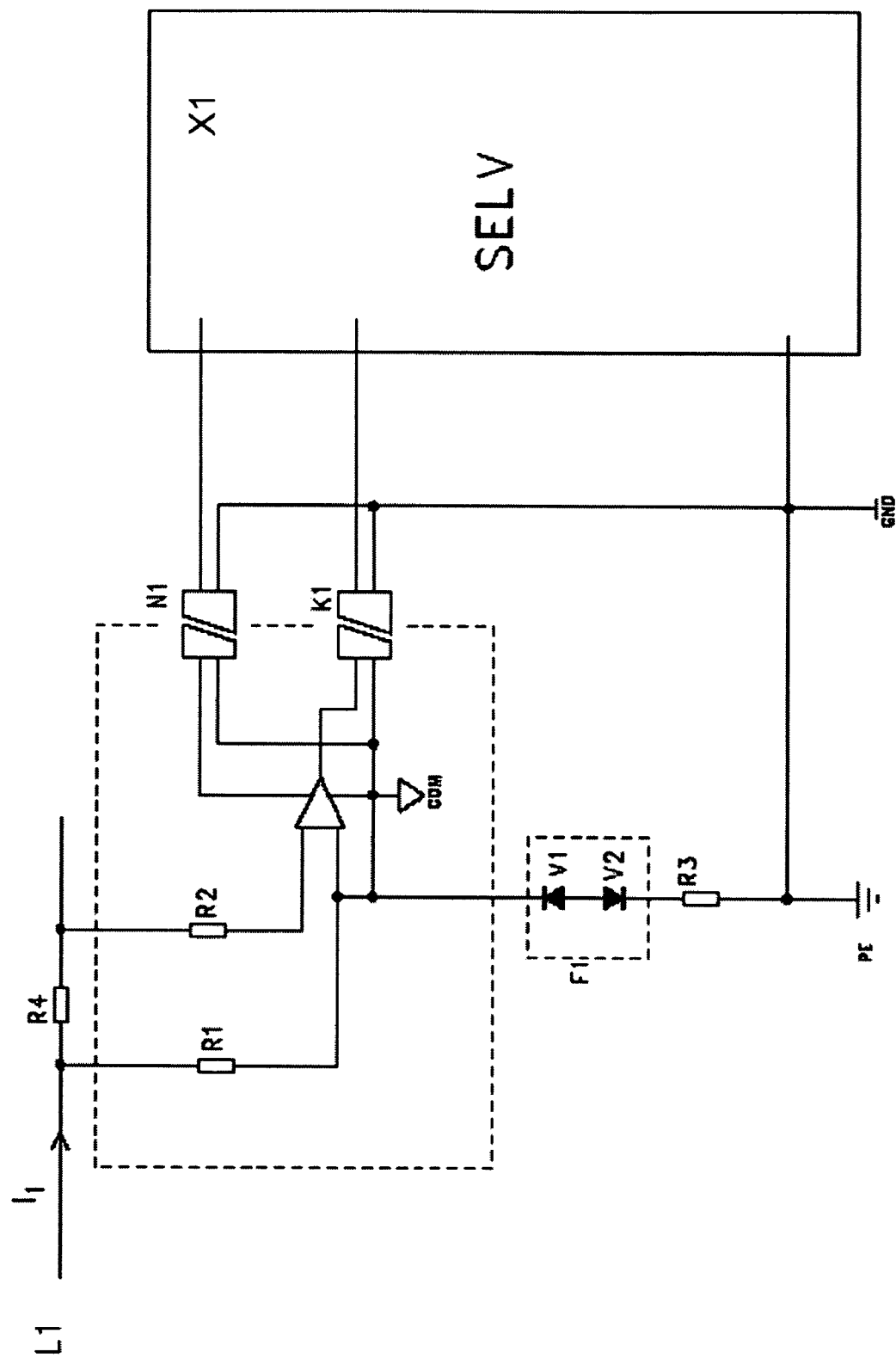
FIG. 1 illustrates a floating neutral point earthing arrangement for single-phase current measurement.

FIG. 1 illustrates an exemplary arrangement in connection with single-phase current measurement. The circuit under measurement includes a low (typically 1 . . . 100 mΩ, or lesser or greater) series resistance (R4), and the current (I1) in the circuit is determined on the basis of Ohm's Law by measuring the voltage drop across the resistance. The input of the measurement electronic circuit includes high resistances (R1, R2), typically 10 MΩ.

The artificial neutral point (COM) of the measurement electronics part, separated by a dashed line in the figure, is connected to the potential of the live conductor through one of the resistances (R1). Power supply to the measurement electronics can be arranged from the SELV electronic circuit (X1) using a DC/DC converter (N1) with sufficient dielectric strength, for example 3 kV.

The measurement result is either transmitted in analogue form through an opto-isolator (K1) to the SELV electronic circuit or, alternatively, the analogue signal is converted into a digital signal, such as in serial format, which allows the use of an inexpensive and stable type of opto-isolator. The artificial neutral point (COM) of the measurement electronics is connected to protective earth (PE) using a grounding (that is, an earthing arrangement) with an overvoltage protection arrangement based on breakdown.

The overvoltage protection arrangement can be implemented by a series connection of at least one diode (V1) in the reverse direction and at least one diode (V2) in the forward direction. The type of diode can be selected so that its reverse breakdown voltage $U_b$ is higher than the peak value of sinusoidal phase voltage $U_v$ in the circuit under measurement, in other words $U_b > 1.42 * U_v$. On the other hand, the breakdown voltage can be lower than the dielectric strength of the components between the artificial neutral point (COM) and the SELV circuit (X1). In practice, components can be selected to bring the breakdown voltage close to the upper limit of the dielectric strength of the component (K1, N1), which minimizes the power loss in the high-resistance resistors (R1, R2). Two or more diodes can be connected in series in the same direction to adjust the breakdown voltage of the arrangement. When the instantaneous voltage of the neutral point of the measurement electronics in relation to protective earth (PE) increases so that the reverse breakdown voltage of the diode is exceeded, this causes a so-called avalanche breakdown that increases the current and can prevent the voltage from increasing and destroying the SELV interface components (K1, N1).

The voltage remaining across the forward diode, for example, less than 1 V, does not have any significance for practical dimensioning. A series resistance (R3) can be connected in series with the diodes, but attention should be paid to the fact that the voltage remaining across the resistance may not increase the total voltage of the arrangement above the maximum voltage of the SELV interface components (K1, N1) in testing or fault conditions. If the resistor (R1, R2) is in the order of 10 MΩ, a series resistance (R3) of 100 kΩ will increase the voltage of the arrangement by approximately 100 V in an impulse test. When using one protective chain (F1), the arrangement can be connected directly to protective earth (PE) instead of a series resistance (R3).

The neutral potential of SELV electronics (GND) can be connected directly to protective earth (PE).

Figure 2:
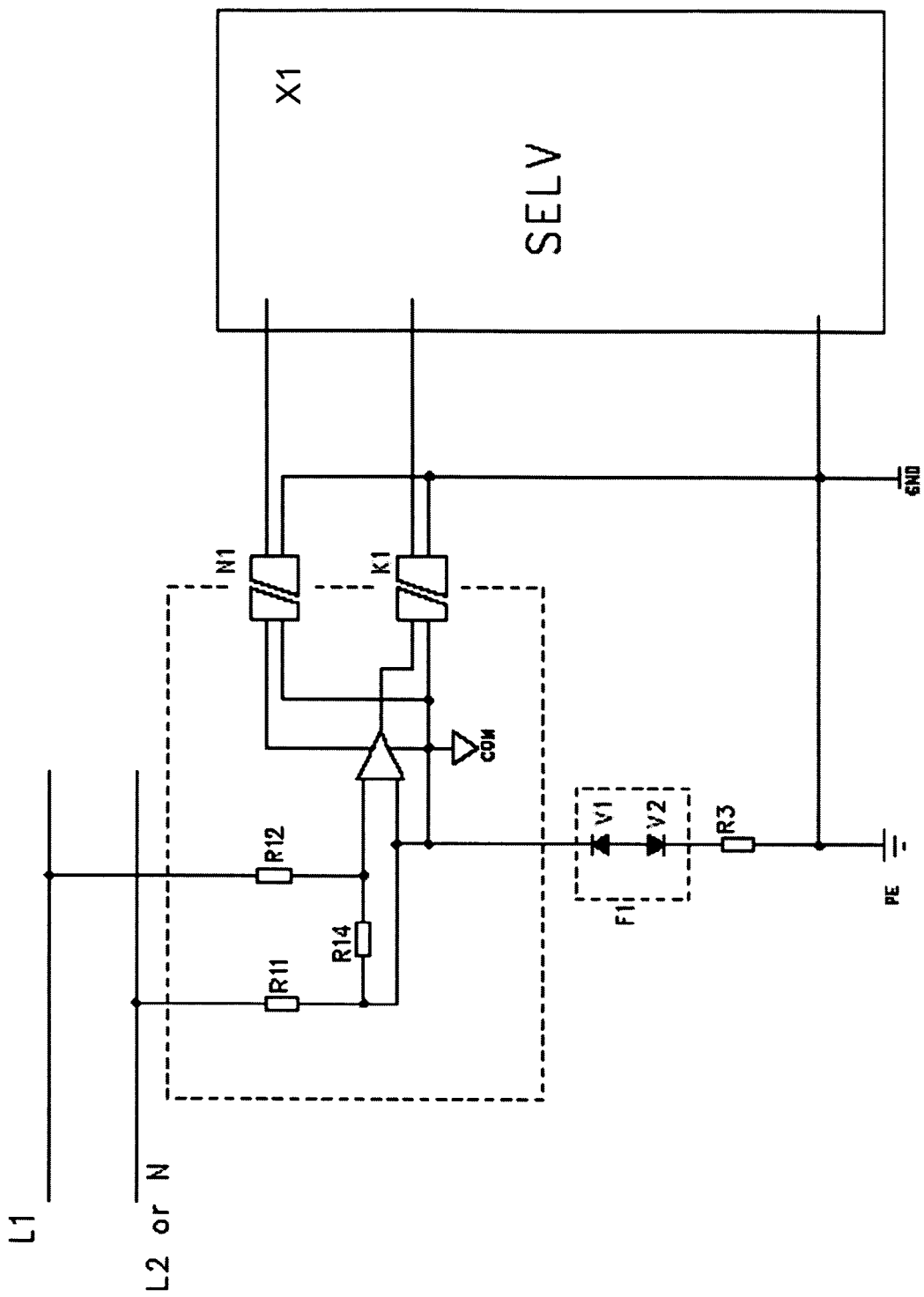
FIG. 2 illustrates an earthing arrangement for single- or two-phase voltage measurement.

FIG. 2 illustrates a similar earthing and overvoltage protection arrangement in connection with single- or two-phase voltage measurement. The measurement electronics are connected to the first phase conductor (L1) through a high resistance (R11) and to the second phase conductor (L2) or, alternatively, to the neutral conductor (N) through a resistance (R12). A voltage division resistance (R14) is connected in series between the resistances (R11, R12) referred to in the above. The neutral point (COM) of the measurement electronics is connected through a high resistance (R11) to the potential of the second phase or the neutral conductor, and on the other hand, through an earthing and overvoltage protection arrangement according to an exemplary embodiment (V1, V2, R3) to protective earth (PE).

Figure 3:
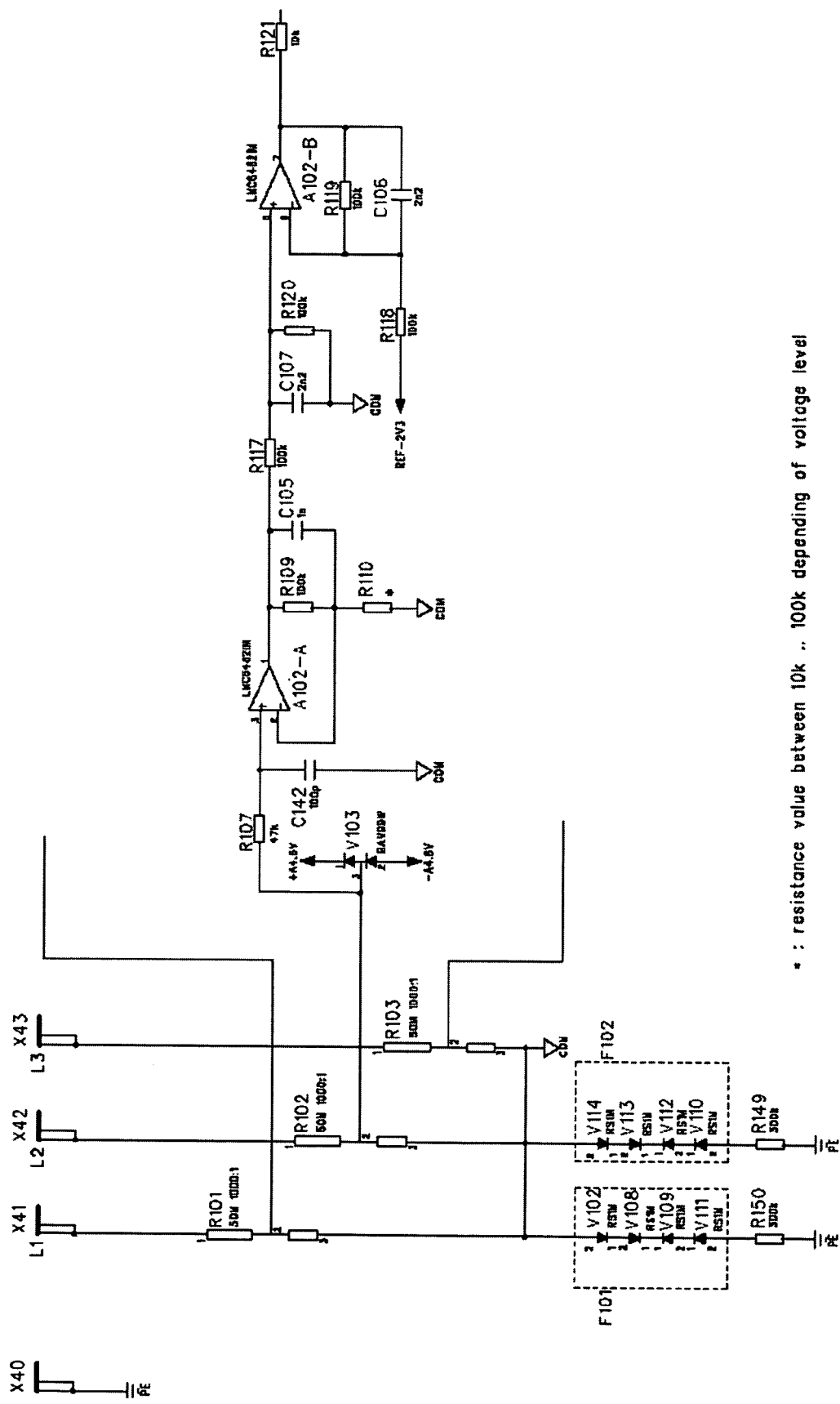
FIG. 3 illustrates an earthing arrangement in the circuit diagram for the analogue part of a three-phase voltage measurement device.

The circuit diagram in FIG. 3 illustrates the analogue part of a three-phase voltage measurement circuit. There is one amplification and level conversion means for each of the phases to be measured; the circuit diagram shows this only for one phase (L2).

The first ends of high-resistance voltage divider resistors (R101, R102, R103) are coupled through connectors (X41, X42, X43) to the corresponding main voltage (L1, L2, L3), and the other ends are connected to a star arrangement, forming an artificial neutral point serving as the neutral potential for the measurement electronics. The artificial neutral point can be earthed in accordance with an exemplary embodiment. The type of overvoltage protector can be chosen so that the breakdown voltage $U_b$ of the arrangement is higher than the peak value of sinusoidal phase voltage in the circuit under measurement—that is, for example, $U_b > \sqrt{2}/\sqrt{3} * U$, rounded to $U_b > 0.82 * U$, because the earthing resistance may not decrease in case of single-phase earth fault.

On the other hand, the breakdown voltage should be lower than the dielectric strength of the components between the artificial neutral point and the SELV circuit. The diode chain has two series-connected diodes (V102, V108, V109, V111) in each direction. The diodes can be, for example, of the type Fairchild RS1M; the manufacturer's specification for the maximum continuous rated voltage strength in the reverse direction is 1000 V, but at a temperature of 25° C., the breakdown voltage is approximately 120% of the rated value, meaning that an avalanche breakdown takes place when the voltage across two diodes connected in series in the same direction exceeds 2400 V.

A resistance of, for example, 300 kΩ (R150) can be connected to protective earth (PE) in series with the diode chain, because in order to improve reliability, an essentially similar chain (V114, V113, V112, V110, R149) is connected in parallel with the diode-resistance chain described in the above in a redundant fashion. The resistances (R150, R149) are added to the chains because the breakdown voltages of the diodes are not exactly identical and, if diode chains were connected in parallel, only the chain with a lower breakdown voltage would conduct; by adding resistances to both chains, the breakdown current can be divided into two chains.

For example, if the tolerance of the diode breakdown voltage values is assumed to be 10%, the dimensioning breakdown voltage of the chain is $U_b = 0.9 * U_c$, where $U_c$ is the lowest dielectric strength of the SELV interface components (K1, N1). If the peak value of an overvoltage surge is designated by $Us_{max}$ and the resistance of a resistor connected to a phase conductor is designated by $R_e$, the value $R_d$ of a series resistor (R150, R149) can be calculated on the basis of Ohm's Law and Kirchhoff's Law of Voltages $R_d = 0.1 * U_c * R_e / (Us_{max} - U_c)$. In connection with a three-phase measuring connection, it should be noted that the overvoltage test is conducted with the phase connections coupled to each other, so in the example case, the resistance of the resistor $R_e = 50$ MΩ/3=16.7 MΩ.

The voltage divider resistors (R101, R102, R103) can have a very high resistance value; the total resistance between pins 1 to 3 can, for example, be 50 MΩ and the sub-resistance between pins 2 and 3 can have a relation of 1:1000 to the total resistance.

Because the AC voltage coming out of the middle pin of the voltage divider resistors can be bipolar—that is, symmetric in relation to the artificial neutral point potential—the signal level can be converted to the positive voltage range of 0 . . . +5 V, which allows the use of an inexpensive unipolar A/D converter.

The output voltage from pin 2 of the voltage divider resistor (R102), which can be an AC voltage on the order of less than 1 V, is first limited as a precaution against possible overvoltage surges by connecting the signal lead to the middle electrode of the dual diode (V103). A dual diode, such as the type Philips BAV99W, includes two very fast diodes integrated in a single casing and connected in series in the same direction. It is also possible to connect a discrete forward diode to the positive side of the electronics supply voltage and, correspondingly, a reverse diode to the negative side. The resistor (R107) and capacitance (C142) form a low-pass filter for high-frequency interference that may be present in the measurement signal (exceeding 15 kHz, for example).

An operational amplifier (A102-A) together with resistors (R109, R110) forms a non-inverting amplification stage that includes an added capacitance (C105) to attenuate any interference present in the signal. The resistance (R110) is dimensioned in accordance with the voltage to be measured, in practice corresponding to the other component values specified in the circuit diagram, R110=10 kΩ . . . 100 kΩ. An operational amplifier (A102-B) together with resistors (R117, R120, R119, R118) and capacitances (C107, C106) forms a differential amplifier. The AC signal that is symmetric on both sides of the floating neutral point potential can be converted completely to the positive side by connecting the measurement signal amplified in the first stage to the positive input of the differential amplifier, and the negative input is connected to a reference voltage generated in the power supply part (not shown), an exemplary magnitude of which is one-half of the negative supply voltage of the amplifier circuits.

The signal corresponding to the measured phase voltage can be connected through a resistance (R121) to a multi-channel unipolar A/D converter (not shown), for example of the type Texas Instruments ADS 7841. On the side of the SELV circuit, the serial output signal from the A/D converter is coupled through an opto-isolator (not shown), such as a Fairchild HCPL-0601, to, for example, an SPI bus, to be transmitted further to an instrumentation and control system.

The essential substance of the exemplary connection described in the above is an earthing and overvoltage protection arrangement that allows a sufficient dielectric strength to be achieved. In accordance to the standard IEC 60947, proof of enhanced insulation between an AC network rated at 1000 V and SELV circuits requires a surge level of 14.8 kV (1.2/50 µs) in an impulse test. On the other hand, unearthed IT networks can include a sufficiently high impedance between the floating neutral point of a measurement circuit and protective earth—that is, a very small leak current. Such requirements can be realized if, for example, the earthing and overvoltage protection arrangement only starts to allow the flow of leak current when the voltage exceeds 820 V in a three-phase network with a 1000 V main voltage but remains below the dielectric strength of the selected DC/DC switching-mode power supply and opto-isolator, which can be 3 kV, for example. Because the voltage divider resistances (R101, R102, R103) have a very high resistance rating, the leak current level of the earthing and overvoltage protection arrangement remains below 1 mA in impulse tests, which means that the arrangement can be implemented using inexpensive but still reliable and fast rectifier diodes with a rated reverse breakdown voltage of 800 to 1000 V.

Compared, for example, to the use of isolation transformers, the exemplary advantages of the arrangement described herein include smaller size, lower mass of the components, inexpensive price and a good dielectric strength structure. High-resistance voltage divider resistors can endure severe overvoltage conditions in the network without becoming damaged; voltage transformers, on the other hand, require fuse and varistor protection. An exemplary advantage of exemplary embodiments in comparison to high-resistance neutral point earthing is that the number of devices connected in parallel does not need to be limited. A measurement arrangement for network quantities where analogue measurement results are converted into digital format as close to the object being measured as possible increases the fault tolerance of the system. When applying features described herein to different electronic circuits, attention should be paid in the design phase to the fact that the electronic circuit should operate without a galvanic connection to earth. Embodiments are widely applicable to, for example, single-phase current measurement. The number of diodes connected in series and the number of parallel branches may vary.

Exemplary embodiments can also be used in conjunction with increased voltage levels, overvoltage categories or pollution degrees. In an increased number of cases, the distribution voltage used in industry is 690 V instead of the 400 V. The use of the IEC 60947-1 standard in equipment design instead of IEC 61131-2, for example, also favors exemplary embodiments described herein.

Though exemplary embodiments are described herein, it must be understood that a person skilled in the art will be able to apply the present invention in different forms within the limits specified by the claims, for example in connection with direct-current circuits.

What is claimed is:

1. An earthing and overvoltage protection arrangement for an electronic device in a power distribution system, comprising:
    a neutral point (COM) of the electronic device coupled to a potential of the power distribution system by a high-impedance connection through at least one resistance; and
    an electronic device interface to a SELV circuit through at least one electronic component, wherein the neutral point of the electronic device is connected to protective earth through at least one breakdown-based overvoltage protector, and wherein a rated breakdown voltage of the overvoltage protector is higher than a potential difference present across it in normal operating conditions but lower than a minimum dielectric strength of the electronic component forming the interface between the electronic device and the SELV circuit.

2. An earthing and overvoltage protection arrangement according to claim 1, wherein the overvoltage protector is formed of at least two reverse-coupled semiconductor PN interfaces in series.

3. An earthing and overvoltage protection arrangement according to claim 1, wherein the overvoltage protector is formed of at least two reverse-coupled diodes in series.

4. An earthing and overvoltage protection arrangement according to claim 3, wherein the diodes are fast rectifier diodes.

5. An earthing and overvoltage protection arrangement according to claim 1, wherein the overvoltage protector is a varistor.

6. An earthing and overvoltage protection arrangement according to claim 1, wherein the overvoltage protector is a spark gap protector.

7. An earthing and overvoltage protection arrangement according to claim 1, wherein a resistance is connected in series with the overvoltage protector.

8. An earthing and overvoltage protection arrangement according to claim 1, wherein in connection with a voltage measurement arrangement for a power distribution system with at least three phases, a first end of each voltage division resistance is connected to a corresponding phase and another end is connected to a star, forming an artificial neutral point serving as the neutral point of the electronic device.

9. An earthing and overvoltage protection arrangement according to claim 1, configured as a measurement device for an electrical quantity, in combination with a power distribution system.

10. An earthing and overvoltage protection arrangement according to claim 2, wherein the overvoltage protector is formed of at least two reverse-coupled diodes in series.

11. An earthing and overvoltage protection arrangement according to claim 10, wherein the diodes are fast rectifier diodes.

12. An earthing and overvoltage protection arrangement according to claim 11, wherein a resistance is connected in series with the overvoltage protector.

13. An earthing and overvoltage protection arrangement according to claim 12, wherein in connection with a voltage measurement arrangement for a power distribution system with at least three phases, a first end of each voltage division resistance is connected to a corresponding phase and an other end is connected to a star, forming an artificial neutral point serving as the neutral point of the electronic device.

* * * * *

UNITED STATES PATENT AND TRADEMARK OFFICE
CERTIFICATE OF CORRECTION

PATENT NO. : 7,656,638 B2 Page 1 of 1
APPLICATION NO. : 11/600817
DATED : February 2, 2010
INVENTOR(S) : Laakso et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 209 days.

Signed and Sealed this

Thirtieth Day of November, 2010

David J. Kappos
*Director of the United States Patent and Trademark Office*